United States Patent [19]
Yamashita et al.

[11] Patent Number: 5,969,417
[45] Date of Patent: Oct. 19, 1999

[54] CHIP PACKAGE DEVICE MOUNTABLE ON A MOTHER BOARD IN WHICHEVER OF FACEDOWN AND WIRE BONDING MANNERS

[75] Inventors: Koji Yamashita; Yasunori Tanaka; Eiji Hagimoto, all of Tokyo, Japan

[73] Assignee: NEC Corporation, Tokyo, Japan

[21] Appl. No.: 08/917,365

[22] Filed: Aug. 26, 1997

[30] Foreign Application Priority Data

Aug. 27, 1996 [JP] Japan ................................. 8-225278
Dec. 11, 1996 [JP] Japan ................................. 8-330678

[51] Int. Cl.⁶ .................................................. H01L 23/48
[52] U.S. Cl. ........................ 257/693; 257/786; 257/778
[58] Field of Search ................................... 257/784, 690, 257/692, 693, 678, 734, 779, 786, 778

[56] References Cited

U.S. PATENT DOCUMENTS

| | | | |
|---|---|---|---|
| 4,860,087 | 8/1989 | Matsubara et al. | 257/786 |
| 5,258,330 | 11/1993 | Khandros et al. | 437/209 |
| 5,703,405 | 12/1997 | Zeber | 257/777 |

FOREIGN PATENT DOCUMENTS

| | | |
|---|---|---|
| 0 081 135 | 6/1983 | European Pat. Off. |
| 62-5649 | 1/1987 | Japan. |
| 2-288245 | 11/1990 | Japan. |
| 8-64717 | 3/1996 | Japan. |
| 8-115935 | 5/1996 | Japan. |

*Primary Examiner*—Olik Chaudhuri
*Assistant Examiner*—Nathan Kelley
*Attorney, Agent, or Firm*—Young & Thompson

[57] ABSTRACT

A chip package device comprises on its outside surface a plurality of wire bonding electrodes adjacent a plurality of facedown electrodes. The chip package device comprises an IC chip having a plurality of chip electrodes on its face surface and a contact sheet having an inside surface on the face surface and comprising on the outside surface a plurality of conductor patterns which comprises portions extending through the contact sheet to the chip electrodes, respectively, and defines the facedown and the wire bonding electrodes. Such chip package devices can be mounted on a printed circuit board in whichever of a facedown and a wire bonding manner when primary and secondary pads are formed on the board for mechanical and electrical connection to the facedown electrodes, respectively, and for electric connection by bonding wires to the wire bonding electrodes, respectively.

6 Claims, 10 Drawing Sheets

CHIP PACKAGE DEVICE MOUNTABLE ON A MOTHER BOARD IN WHICHEVER OF FACEDOWN AND WIRE BONDING MANNERS

BACKGROUND OF THE INVENTION

This invention relates to a chip package device or unit and to a multi-chip module which comprises a plurality of chip package devices on a printed circuit board used as a mother board. The chip package device is, for example, a CSP (chip size or scale package) device.

Various manners are known on mounting an IC chip on a mother board. For example, Japanese Patent Prepublication (A) No. 288,245 of 1990 discloses a method in which the IC chip is mounted primarily in a facedown or flipchip manner directly on the mother board to provide an IC package according to a COB (chip on board) technique. A plurality of lead wires are preliminarily bonded to the IC chip and are "outer-bonded" to respective bonding lands formed on the mother board with the lead wires preferably fixed onto a polyimide film to provide a lead frame. As another example, Japanese Patent Prepublication (A) No. 5,649 of 1987 reveals an IC package having a predetermined number of pins including a power supply pin and a grounding pin and furthermore having a greater number of internal terminals which are connected to an IC chip and to the pins and includes at least one additional power supply terminal and at least one additional grounding terminal.

In any event, an IC chip has a face surface and comprises a plurality of electrodes on the face surface. These electrodes will herein be called facedown electrodes merely for convenience of the description which follows. The facedown electrodes are alternatively called electrodes for flipchip mounting. For mounting such an IC chip, a printed circuit board comprises a plurality of pads surrounding an area on which the IC chip can be supported. The pads are called the bonding lands heretobefore and will hereafter be called board pads. According to the above-cited Patent Prepublication No. 288,245 of 1990, the IC chip is mounted primarily facedown on the printed circuit board with the facedown electrodes electrically bonded to the board pads, respectively, by a plurality of bonding wires used as the lead wires. In this structure, the IC chip is mounted on the mother board in a facedown manner, which is known as a flipchip bonding (FCB) technique. According to the above-referenced Patent Prepublication No. 5,649 of 1987, the IC chip is faceup mounted, with the facedown electrodes connected to the internal terminals by the bonding wires, on a mother board which has the pins and on which the internal electrodes are used as the board pads. In this latter structure, the IC chip will be said to be mounted on the mother board in a wire bonding or bonded manner or structure.

On mounting the IC chip directly on the mother board, it is preferred that such IC chips are known good dice, as called in the art, on each of which all tests are already carried out. It is, however, impossible to perform all tests on each IC chip. This is because it is difficult to connect the lead wires to each IC chip for automatic control of the tests. If each chip is tested after mounted on the mother board, characteristics of the IC chip may be subjected to changes. This is because the IC chip is usually sealed in a resin overcoat on the mother board. The resin overcoat inevitably applies stress to the IC chip and a piezoelectric effect on its characteristics. It has consequently been the practice on mounting the IC chips on the mother board to take a certain margin into account in order to achieve a desirable yield.

When IC packages are mounted on the mother board, it is readily possible to test each IC package before mounting on the mother board. The wire bonding structure is therefore preferable insofar as the yield is concerned. It should, however, be noted in the manner described above that a conventional IC package has been one of those used in the facedown and the wire bonding manners. This has restricted a freedom in mounting such an IC package on the mother board.

In the meanwhile, a CSP device is recently developed in which the IC chip is covered with a contact or wired sheet which has an inside surface of a slightly greater area than a chip surface of the IC chip. This recent CSP device enables an electronic device small sized and compactly integrated on the mother board with a high integration density. The recent CSP device is for facedown mounting alone. It is difficult to adopt this CSP device to the wire bonding structure although the wire bonding structure provides merits of a raised reliability of visually confirming connection of the bonding wires to the facedown electrodes.

On the other hand, a CSP device is known as will later be described more in detail. In this CSP device which has an overall size of a known barechip in order to attain the high integration density, the contact sheet comprises the facedown electrodes on its outside or obverse surface in a grid-like configuration of a grid pitch of about 0.5 mm. With a solder ball or bump preliminarily formed on each facedown electrode and with the board pads with creamy solder formed on the mother board in correspondence to the facedown electrodes, the solder balls are brought into contact with the creamy solder of the board pads. An assembly of the mother board and such CSP devices is caused to pass through a heated furnace to make up a multi-chip module.

In general, such a CSP device has a fan-in structure in which the facedown electrodes are formed inside an outline of the device. This restricts the grid pitch and the number of the facedown electrodes.

The CSP device has various tasks which must be solved. One of the tasks is to get rid of a difficulty of applying a predetermined amount of the creamy solder to individual board pads. An unbalanced amount results in deterioration in mechanical attachment and electric connection between each CSP device and the mother board. More particularly, it is usual to mount the CSP device on the mother board together with other electronic components, such as resistors. The creamy solder is applied by screen printing. Under these circumstances, it is next to impossible to apply the creamy solder in an amount desirable for respective electronic components including the CSP devices.

Another of the tasks is to remove a difficulty in coping with a temperature cycle to which the multi-chip module is subjected. In more detail, the CSP device has a thermal expansion coefficient which is far smaller than the printed circuit boards. As a result, a damage takes place in a solder mass composed of each solder ball and the creamy solder when the multi-chip module is taken out of the furnace and also when the multi-chip module is subjected thereafter to a change in ambient temperature.

Still another task arises from the fact that the CSP device is for soldering alone. In other words, it is difficult to resort to the COB technique.

SUMMARY OF THE INVENTION

In view of the foregoing, it is an object of the present invention to provide a chip package device which can be mounted on a printed circuit board in both a facedown manner and a wire bonded manner.

It is another object of this invention to provide a chip package device which is of the type described and which has a raised quality of mount onto the printed circuit board and a raised yield.

It is still another object of this invention to provide a chip package device which is of the type described and in which a long-term insured reliability is had by a solder mass used in mounting such chip packages onto the printed circuit board.

It is a yet another object of this invention to provide a chip package device which is of the type described and which can be mounted on the printed circuit board in any one of various manners at a low cost.

It is a different object of this invention to provide a multi-chip module comprising a printed circuit board on which mounted is at least one chip package device of the type described.

Other objects of this invention will become clear as the description proceeds.

In accordance with an aspect of this invention, there is provided a chip package device comprising an IC chip and a contact sheet having an outside surface and a plurality of facedown electrodes on the outside surface to enclose the IC chip and to provide electric connection to the IC chip, further comprising a plurality of wire bonding electrodes electrically connected on the outside surface to the facedown electrodes, respectively.

In accordance with a different aspect of this invention, there is provided a multi-chip module comprising first and second chip package devices on a printed circuit board, each of the first and the second chip package devices having a chip surface and comprising on the chip surface a plurality of facedown electrodes and a plurality of wire bonding electrodes in one-to-one correspondence to the facedown electrodes, the printed circuit board comprising a plurality of primary pads at positions corresponding to the facedown electrodes and a plurality of secondary pads surrounding an area equal to the chip surface of each of the first and the second chip package devices, the first chip package device being mounted facedown on the printed circuit board with the facedown electrodes brought into mechanical and electrical contact with the primary pads, respectively, the second package device being mounted on the printed circuit board with its chip surface directed away from the printed circuit board and with the wire bonding electrodes electrically connected by bonding wires to the secondary pads, respectively.

DESCRIPTION OF THE PREFERRED EMBODIMENTS

Figure 1:
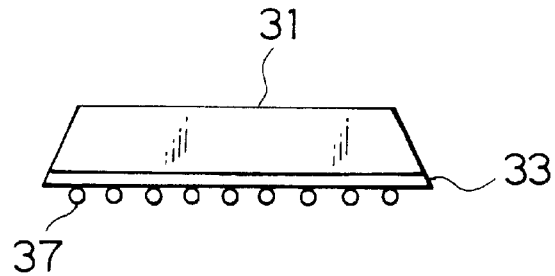
FIG. 1 shows a side view of a conventional chip package device.
Figure 2:
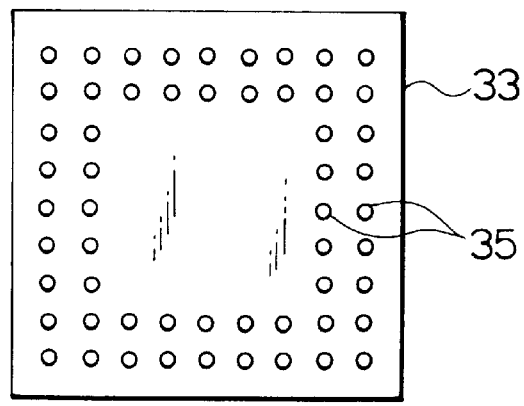
FIG. 2 shows a bottom view of the chip package device depicted in FIG. 1.

Referring to FIGS. 1 and 2, a conventional chip package device will first be described in order to facilitate an understanding of the present invention. The chip package device is a CSP (chip size or scale package) device described heretobefore and will be so called in the following. Throughout the following, similar parts are designated by like reference numerals and are similarly operable.

The CSP device comprises an IC chip 31 and a contact or wired sheet 33 which has an outside or obverse surface bottomwise directed in FIG. 1. The contact sheet 33 encloses the IC chip 31. On the outside surface, the CSP device comprises a plurality of facedown or flipchip electrodes 35 (FIG. 2) providing electric contacts to the IC chip 31 in the manner which will presently be described more in detail. In the example being illustrated, the facedown electrodes 35 are arranged in a grid-like pattern or configuration of a grid pitch of about 0.5 mm, namely, in a configuration of a grid as called in the art. The facedown electrodes 35 are for flipchip mounting of the chip package in the manner which will presently become clear. For this purpose, a plurality of solder balls or bumps 37 (FIG. 1) are formed on the facedown electrodes 35, respectively.

Figure 3:
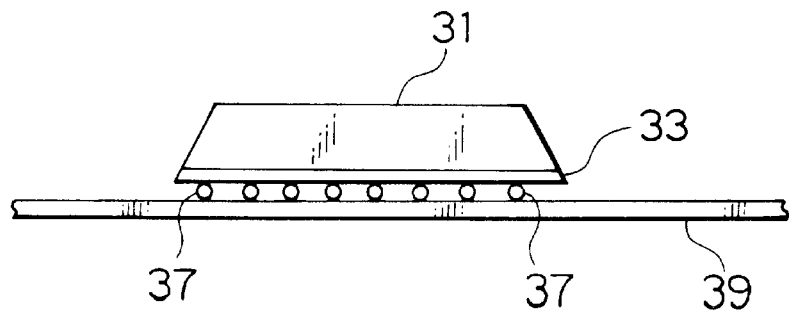
FIG. 3 is a side view of the chip package device of FIG. 1 mounted on a printed circuit board.

Turning to FIG. 3, the CSP device is placed on a printed circuit board 39 in a facedown or flipchip manner, namely, with the outside surface of the contact sheet 33 brought adjacent to the printed circuit board 39. On the printed circuit board 39, a plurality of board pads (later illustrated) are formed in the grid-like configuration of the solder balls 37. Solder layers (not shown) of creamy solder are preliminarily screen-printed on the board pads, respectively. With the solder balls 37 brought into mechanical contact with the solder layers, an assembly of the CSP device and the printed circuit board 39 is caused to pass through a heated furnace (not shown). Molten, the solder layers are united with the solder balls 39 to become solder masses and to mount the CSP device onto the printed circuit board 39.

Figure 4:
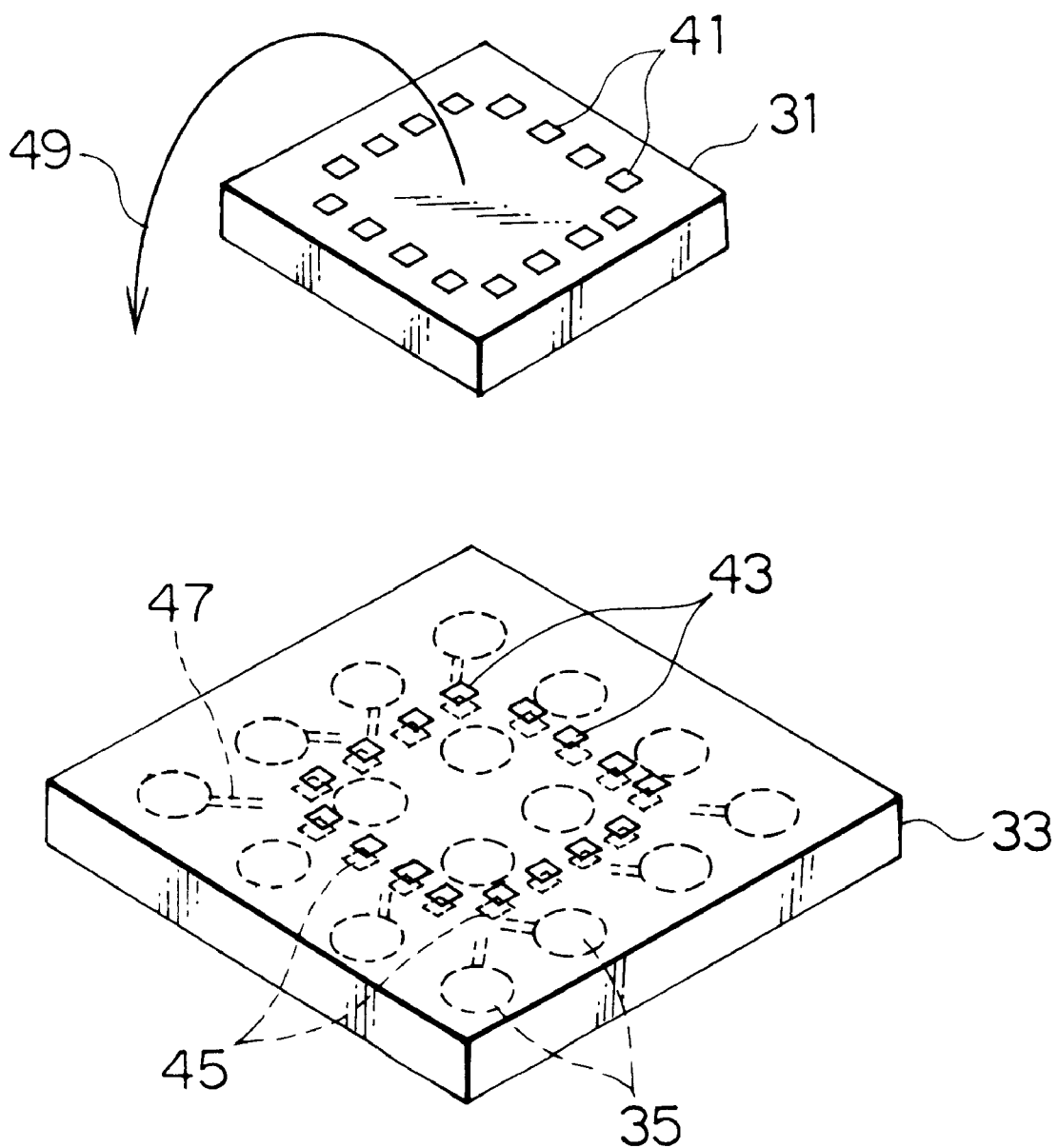
FIG. 4 is an exploded perspective view of a chip package device according to a first embodiment of the Instant invention.

Referring now to FIG. 4, the description will proceed to a CSP device according to a first preferred embodiment of this invention. The IC chip 31 has a chip or face surface directed topwise in the figure and comprises a plurality of chip electrodes 41 on the chip surface. A package substrate 33 serves as the contact sheet 33 described above and is therefore designated by the same reference numeral. Its outside or obverse surface is bottomwise directed as in FIG. 4. The package substrate 33 is herein a rectangular ceramic or resin plate of a slightly greater area than the chip surface, has an inside or reverse surface opposite to the outside surface, and comprises a plurality of support or substrate pads 43 of conductor films on the inside surface in a pattern identical with the chip electrodes 41 in the manner which will later become clear. Connected to the support pads 43 through the package substrate 33, respectively, a plurality of wire bonding electrodes 45 are formed on the outside surface and are connected by outer surface wirings 47 to the facedown electrodes 35 with the facedown and the wire bonding electrodes 35 and 45 made of conductor films.

In the example being illustrated, the IC chip 31 is brought onto the package substrate 33 upside down in the manner indicated by a curved arrow 49 to establish electric connections between the chip electrodes 41 and the support pads 43, respectively. On so bringing the IC chip 31 onto the package substrate 33, films of solder are preliminarily applied to the chip electrodes 41, respectively, as will shortly become clear. The facedown electrodes 35 are arranged in a matrix array with the wire bonding electrodes 45 arranged inside an area on which the chip surface lies. In this connection, it is possible to manufacture the CSP device in the manner which will later be exemplified. At any rate, it is alternatively possible to use the facedown electrodes 35 as the wire bonding electrodes 45, namely, to interchange namings of the electrodes 35 and 45.

Figure 5:
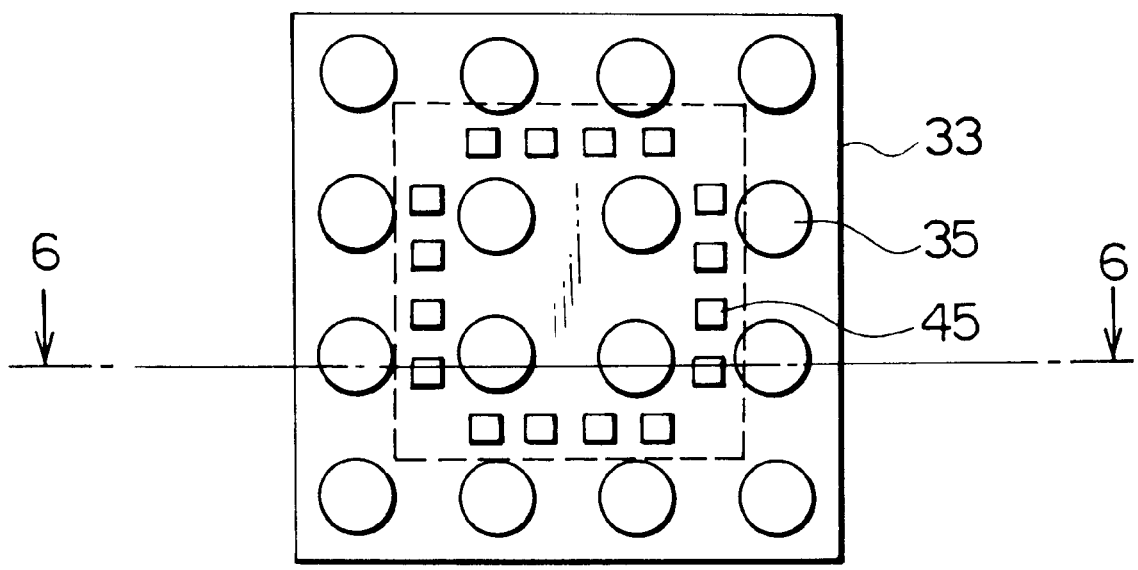
FIG. 5 shows a bottom view of the chip package device illustrated in FIG. 4.
Figure 6:
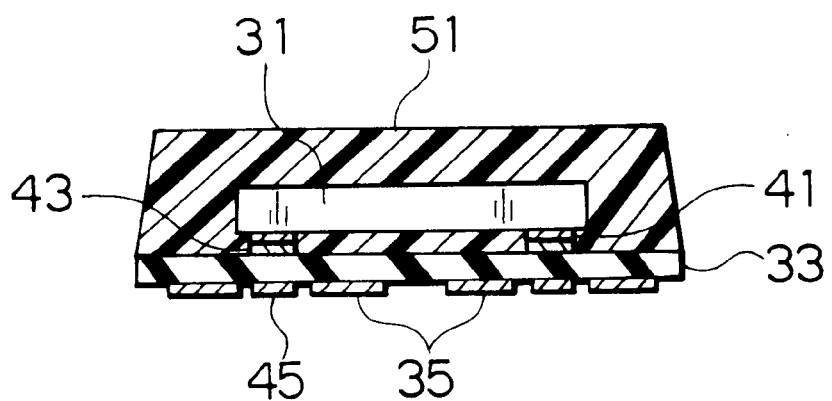
FIG. 6 shows a vertical section taken on a line 6—6 in FIG. 5.

Turning to FIGS. 5 and 6, the electric connections are clearly depicted between the chip electrodes 41 and the support pads 43. After the electric connections are established, a mass of resin 51 is formed to cover the IC chip 31 and a marginal or peripheral area of the package substrate 33. It is now understood that the package substrate 33 should be wider in this case than the chip surface so as to provide the marginal area. In FIG. 5, the chip area is indicated by a dashed-line square.

Figure 7:
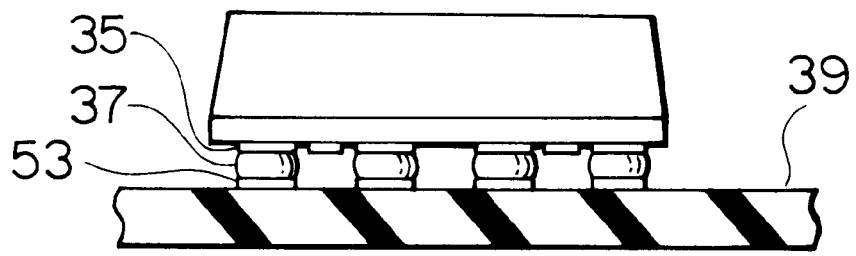
FIG. 7 shows by a side view a first example of the chip package device of FIGS. 4 to 6 mounted on a printed circuit board.

Referring to FIG. 7, the printed circuit board 39 has a top and a bottom principal surface with the above-mentioned board pads formed on the top principal surface and designated by a reference numeral 53. The board pads 53 are positioned in one-to-one correspondence to the facedown electrodes 35 (FIGS. 4 to 6). Like in FIGS. 1 and 3, the solder bumps 37 are preliminarily formed on the facedown electrodes 35, respectively. With such a CSP device placed facedown or flipchip on the printed circuit board 39, the solder bumps 37 are molten to mount the CSP device onto the printed circuit board 39.

Figure 8:
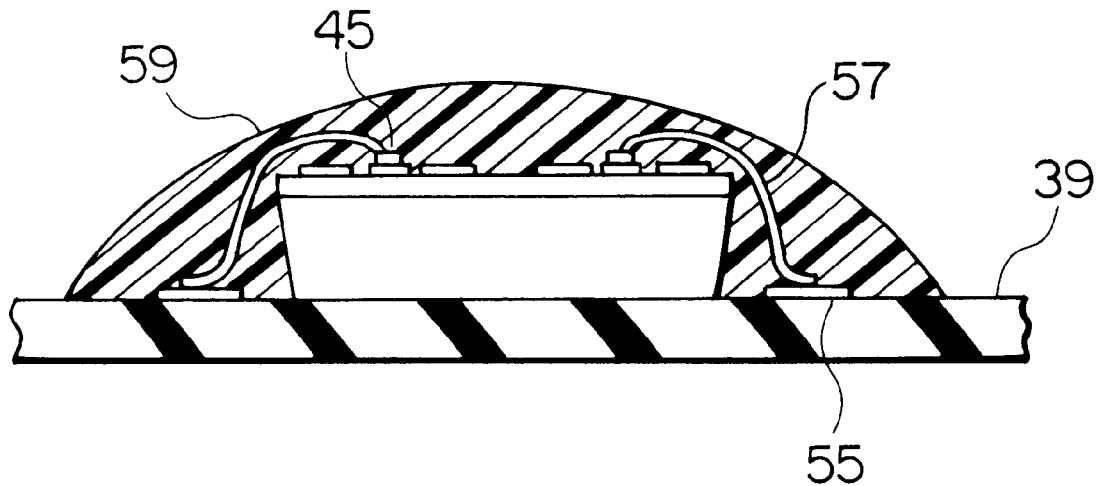
FIG. 8 shows by a side view a second example of the chip package device of FIGS. 4 to 6 mounted on a printed circuit board.

Turning to FIG. 8, similar board pads 55 are formed on the top principal surface of the printed circuit board 39 to surround an area equal to the outside surface of the CSP device or of the package substrate 33. It should be pointed out in this connection that the CSP device has in FIGS. 6 and 7 a top or back surface which are not wider than the outside surface. The board pads 53 of FIG. 7 will be called first or primary pads with the similar board pads referred to as second or secondary pads 55. The CSP device is now faceup placed on the printed circuit board 37 with the outside surface of the package substrate 33 and consequently the chip surface of the IC chip directed topwise in the figure. The wire bonding electrodes 45 are connected to the second pads 55, respectively, by external metal wires or bonding wires 57. The CSP device with the facedown and the wire bonding and the facedown electrodes 35 and 45, an area including the second pads 55 on the top principal surface, and the metal wires 57 are preferably sealed with a resin mass or overcoat 59. It is now understood that the CSP device is mounted on the printed circuit board 37 in the wire bonding or bonded manner mentioned hereinabove.

It is also understood with the structure illustrated with reference to FIGS. 4 to 6 to mount the CSP device on the printed circuit board 39 selectively in whichever of the facedown and the wire bonding manners. For example, the facedown manner is selected when such CSP devices should be mounted in a high integration density. The wire bonding manner is selected when the CSP devices should be mounted with a high reliability.

Figure 9:
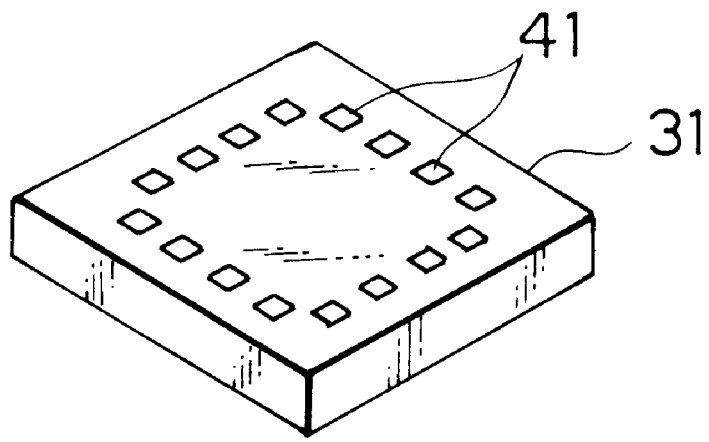
FIG. 9 is an exploded perspective view of a chip package device according to a second embodiment of this invention.
Figure 9:
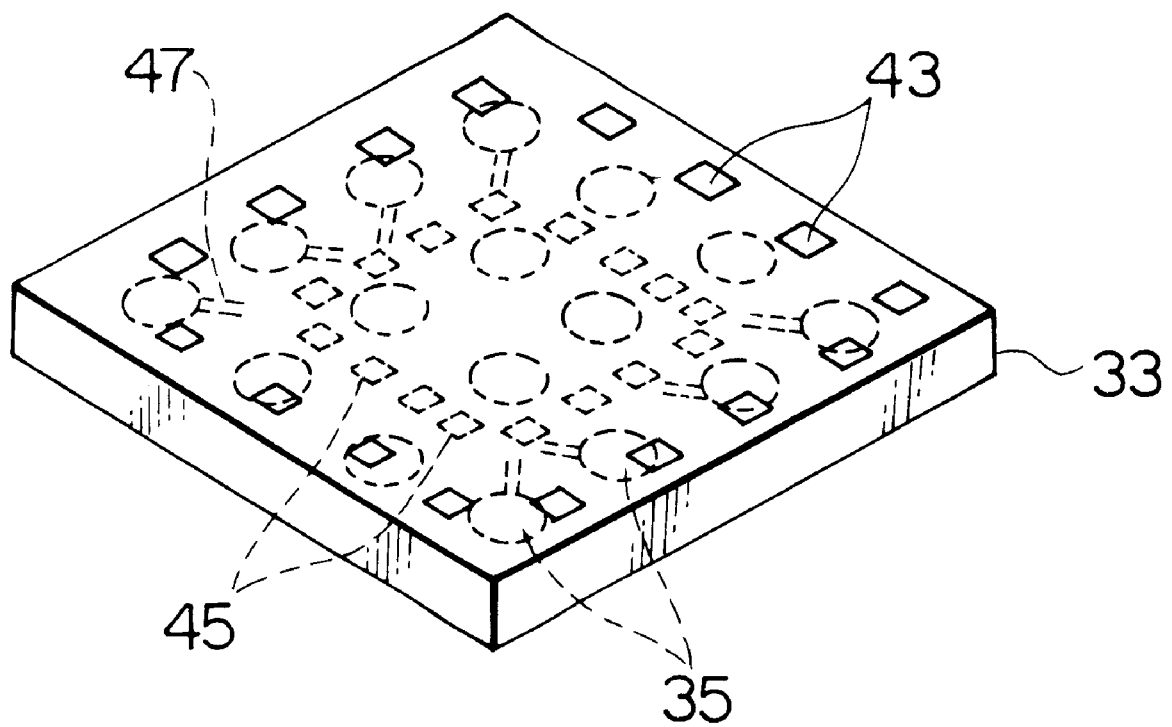

Referring to FIG. 9, attention will be directed to a CSP device according to a second preferred embodiment of this invention. This CSP device is different from that described in conjunction with FIGS. 4 to 6 only in that the support pads 43 are situated at a peripheral portion on the inside surface of the package substrate 33.

Figure 10:
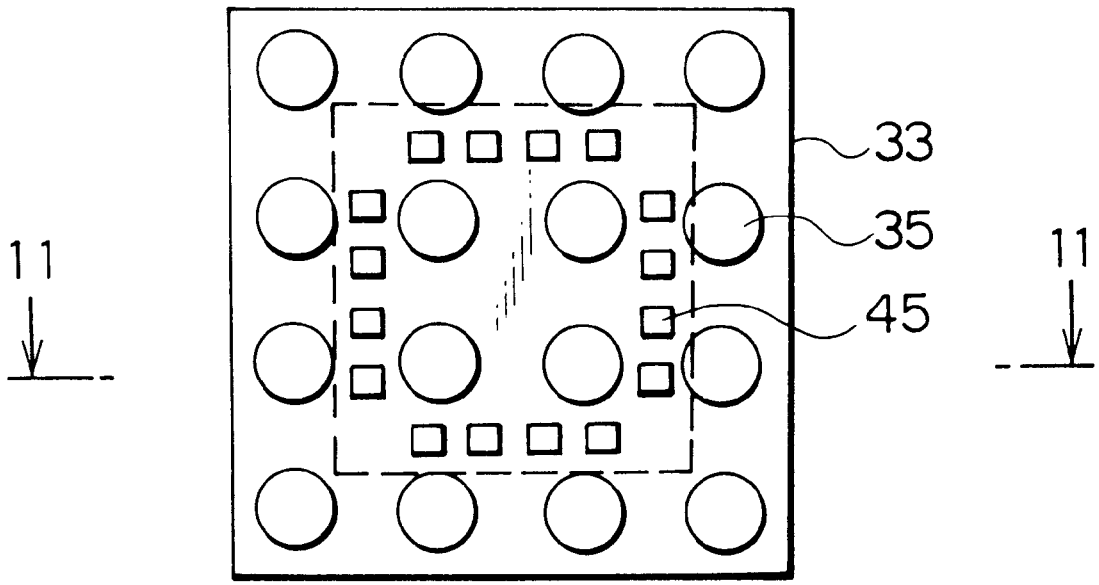
FIG. 10 is a bottom view of the chip package device depicted in FIG. 9.
Figure 11:
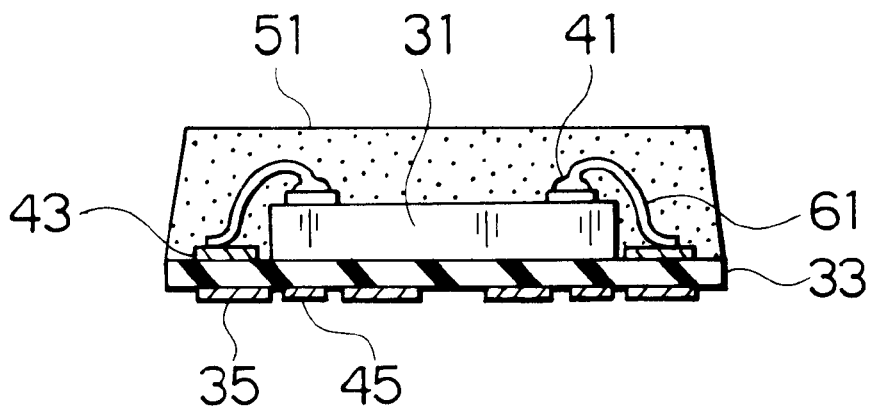
FIG. 11 shows a vertical section taken on a line 11—11 in FIG. 10.

Turning to FIGS. 10 and 11, the IC chip 31 is faceup placed on the package substrate with the chip electrodes 41 topwise directed. It is possible to apply a binding or bonding agent between the IC chip 31 and the package substrate 33. Before covering the IC chip 31 and the marginal area of the package substrate 33 with the mass of resin 51, a plurality of internal metal wires 61 are used to electrically connect the chip electrodes 41 to the substrate pads 43, respectively, according to the technique known as inner lead bonding (ILB).

Reviewing FIGS. 4 to 6 and 9 to 11, it is possible to form the support pads 43 in the pattern described in connection with FIGS. 4 and 6 and also at the peripheral portion described in connection with FIGS. 9 and 11. This makes it possible to attach the IC chip 31 to the package substrate 33 selectively in whichever of facedown and faceup manners provided that the internal metal wires 61 are used when the faceup manner is selected. This enables it without manufacturing a plurality of package substrates, such as 33, for individual uses of the facedown and the faceup manners to the CSP devices of various structures. The CSP device of FIGS. 4 to 6 or of FIGS. 9 to 11 is easy to handle and to get a known good die.

Figure 12:
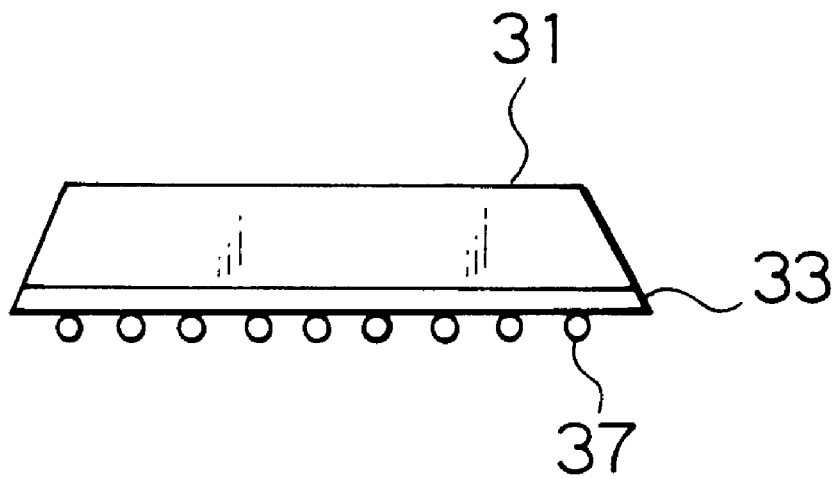
FIG. 12 shows a side view of a chip package device according to a third embodiment of this invention.
Figure 13:
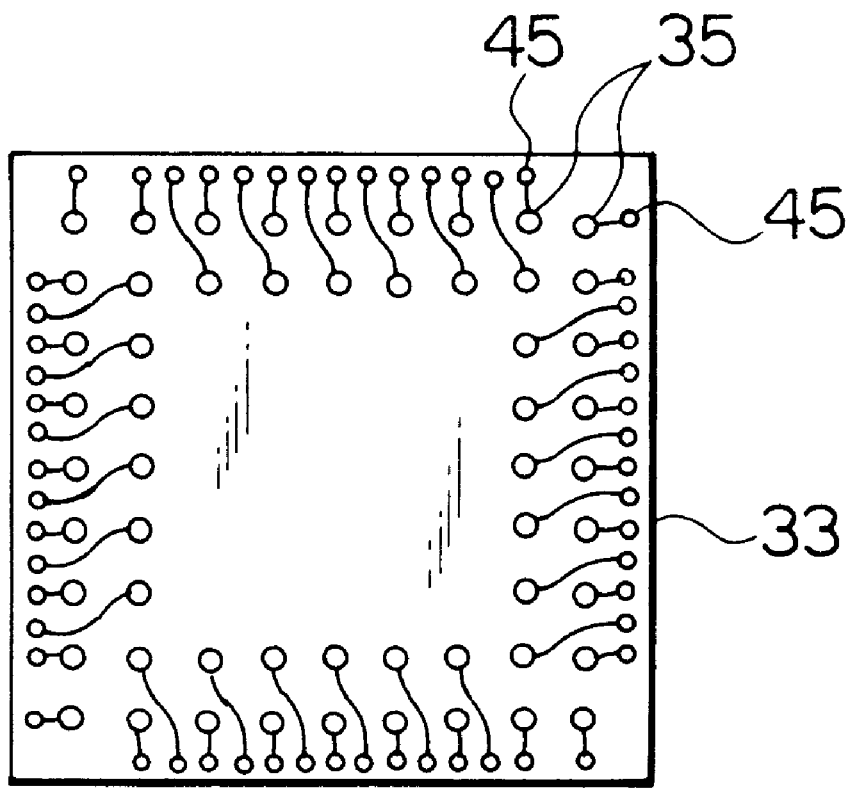
FIG. 13 shows a bottom view of the chip package device illustrated in FIG. 12.

Referring now to FIGS. 12 and 13, the description will proceed to a CSP device according to a third preferred embodiment of this invention. Here, the contact or wired sheet 33 is used in the package substrate and is attached to the IC chip 31 by a binding or bonding agent film (later depicted). Like in FIGS. 4 and 9, the facedown electrodes 35 and the wire bonding electrodes 45 are formed on the outside or obverse surface of the contact sheet 33 and with the solder balls 37 formed like in FIG. 1 on the facedown electrodes 35, respectively. It may be mentioned here that the facedown electrodes 35 and the wire bonding electrodes 45 can simultaneously be formed. Incidentally, the solder balls 37 are used only when the CSP device should be facedown mounted on the printed circuit board 39 with the solder balls 37 used in the manner described in conjunction with FIG. 7.

Figure 14:
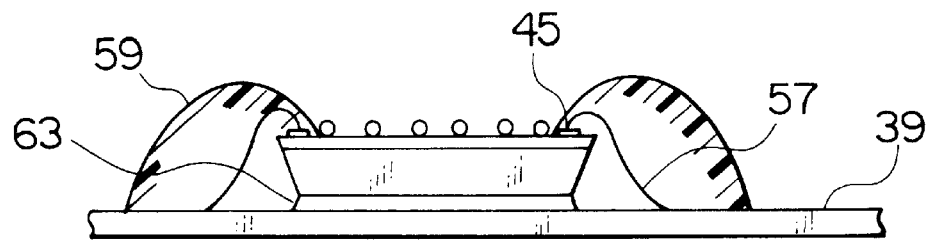
FIG. 14 shows partially in vertical section a side view of a first example of the chip package device of FIGS. 12 and 13 mounted on a printed circuit board.

Turning to FIG. 14, the CSP device is attached to the printed circuit board 39 by a bonding layer 63 of a binding or bonding agent. The board pads 55 (FIG. 8) are not shown herein. The external metal wires 57 are used to electrically connect the wire bonding electrodes 45 to the board pads 55. The CSP device has a sufficient reliability during a long-continued term and needs no protection. In order to mechanically protect the metal wires 57, the resin mass 59 is used in an anchor ring shape around the CSP device.

Figure 15:
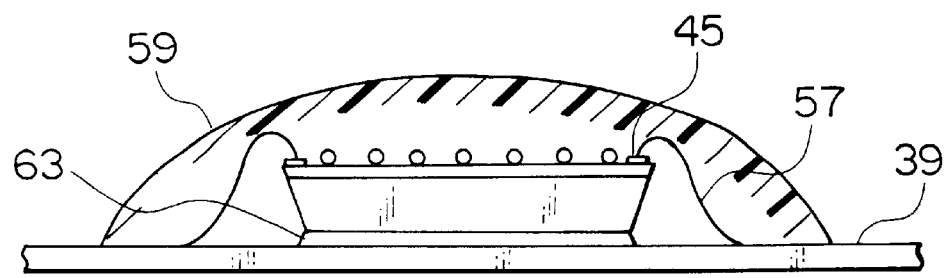
FIG. 15 shows partially in vertical section a side view of a modified example of the chip package device of FIGS. 12 and 13 mounted on a printed circuit board.

Further turning to FIG. 15, the CSP device is faceup mounted on the printed circuit board 39 with a modification with respect to the faceup manner illustrated with reference to FIG. 14. The modification resides in use of the resin mass 59 in the manner described in conjunction with FIG. 8.

Figure 16:
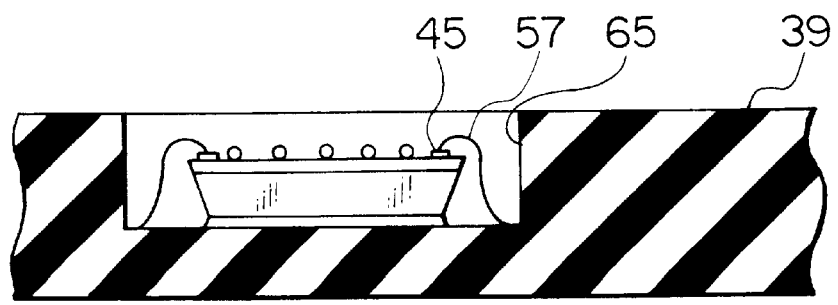
FIG. 16 shows partially in vertical section a side view of a further modified example of the chip package device of FIGS. 12 and 13 mounted on a printed circuit board.

Still further turning to FIG. 16, the CSP device is mounted on the printed circuit board 39 with a further modification of the faceup manner described in conjunction with FIG. 14. Herein, an indent 65 is formed from the top principal surface into the printed circuit board 39 to have a bottom surface. It is convenient to understand that the bottom surface is a stepped portion of the top principal surface. The board pads 55 (FIG. 8) are formed on this portion of the top principal surface. It is preferred that the metal wires 57 do not extend out of the indent 65 topwise in the figure. Although not depicted, the resin mass 59 (FIG. 15) may be used to fill the indent 65.

Figure 17:
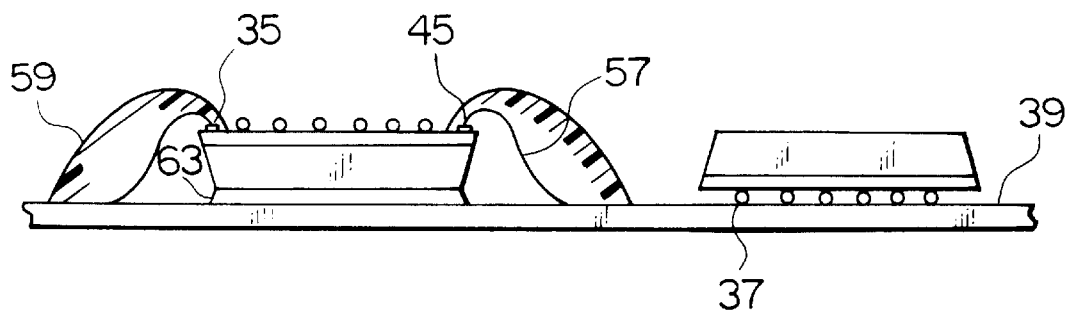
FIG. 17 is a side view of a multi-chip module comprising, in accordance with this invention, a plurality of chip package devices, each being of the type illustrated in FIGS. 12 and 13.

Referring now to FIG. 17, the description will proceed to a multi-chip module according to this invention. In FIG. 17, first and second CSP devices are exemplified on left and right sides. The first CSP device is faceup mounted on the printed circuit board 39 in the manner described in conjunction with FIG. 14. The second CSP device is mounted on the printed circuit board 39 as described in connection with FIG. 7.

Figure 18:
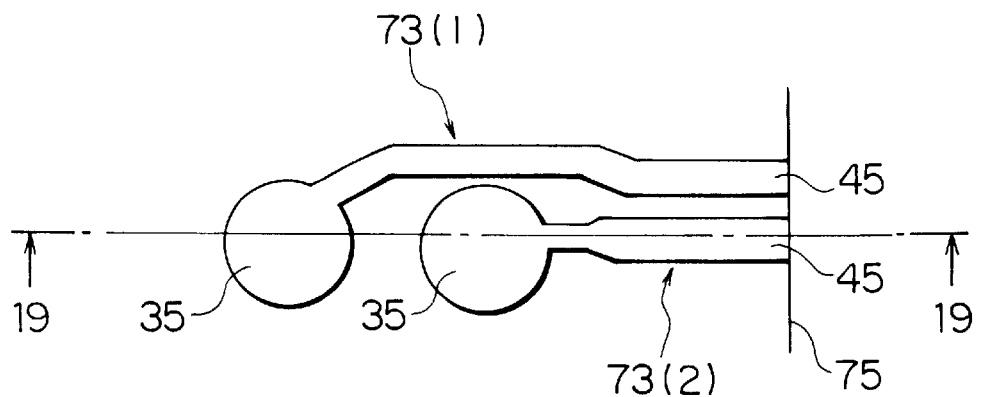
FIG. 18 shows a top view of a principal part of a chip package device according to a fourth embodiment of this invention.
Figure 19:
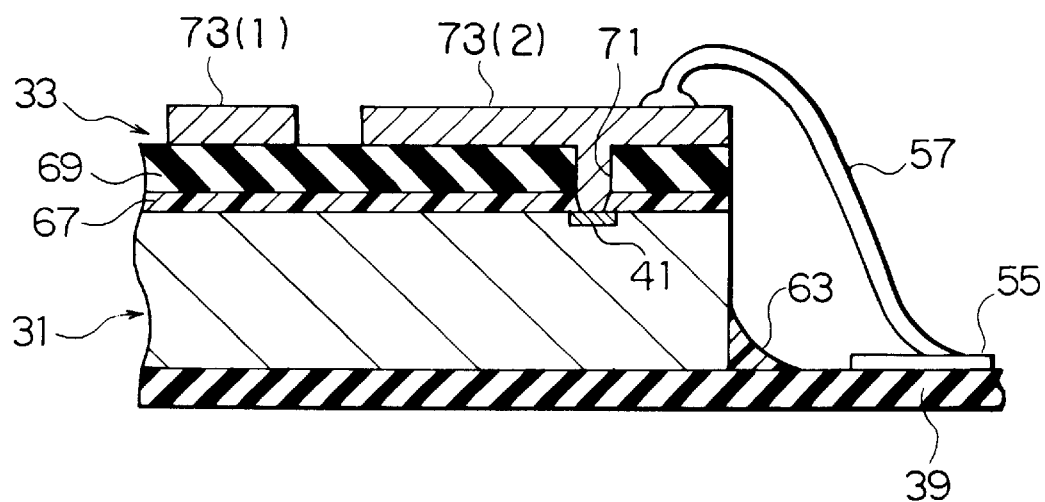
FIG. 19 shows a vertical section taken on line 19—19 in FIG. 18.

Referring to FIGS. 18 and 19, attention will be directed to a CSP device according to a fourth preferred embodiment of this invention. Herein, the IC device 31 and the contact sheet 33 are afresh described in greater detail. The IC chip comprises a silicon chip having the chip surface directed topwise. On the chip surface, the chip electrodes 41 are formed by aluminium in the manner described in conjunction with FIGS. 4 and 9. Only one of the chip electrodes 41 is seen in FIG. 19 as formed into the silicon chip in the manner known in the art.

Attached to the chip surface with the bonding film interposed as shown at 67, the contact sheet 33 comprises an insulator tape 69 attached to the chip surface by the bonding film 67. Tape holes, such as 71, are formed through the tape 69 to be colinear with film holes formed through the bonding film 67 to reach the chip electrodes 41, respectively. A plurality of conductor patterns or films, such as 73(1) and 73(2) are formed of copper with gold plating thereon on the outside or obverse surface of the tape 69 to reach the chip electrodes 41 through the holes, such as 71, formed colinearly through the tape 69 and the bonding film 67. It is readily understood that an area of contact of the chip electrode 41 with a vertical bottomwise extension of the conductor pattern 73(2) used as one of the support pads 43 described in conjunction with FIGS. 4 and 5. As is clear in FIG. 18, each conductor pattern 73 (the suffixes (1) and (2) omitted) has a circular portion, an end portion, and a connection between the circular and the end portions. The circular and the end portions serve as the facedown electrodes 35 and the wire bonding electrodes 45, respectively. Although not indicated in FIGS. 18 and 19 by the reference numeral 47, the connection serves as each of the surface wirings 47.

In the example being illustrated, a chip edge 75 is had by the IC chip 31. The wire bonding electrodes 45 are disposed inside the chip edge 65 to provide a fan-in structure. The IC chip 31 is faceup supported on the printed circuit board 39 with the bonding layer 63 used only at a corner portion surrounding the chip edge 75.

Figure 20:
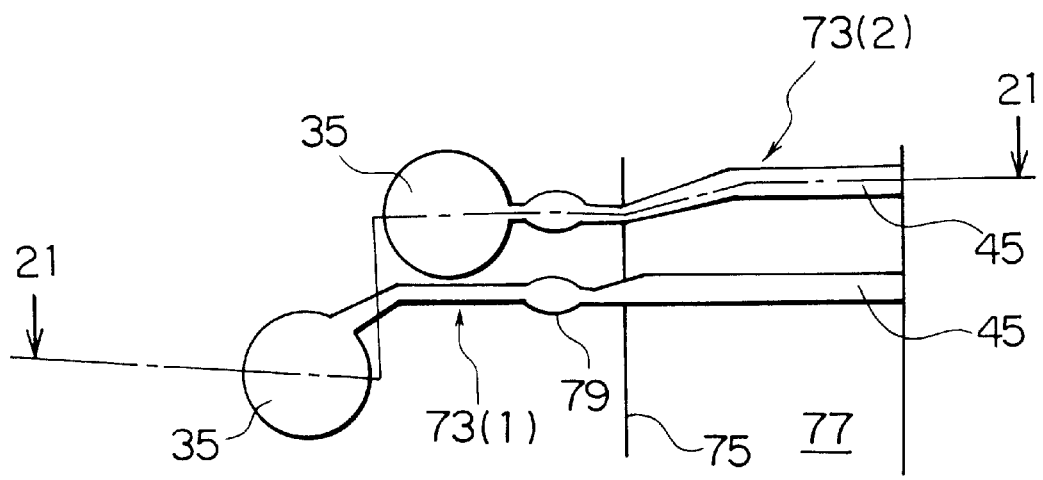
FIG. 20 is a top view of a principal part of a chip package device according to a fifth embodiment of this invention.
Figure 21:
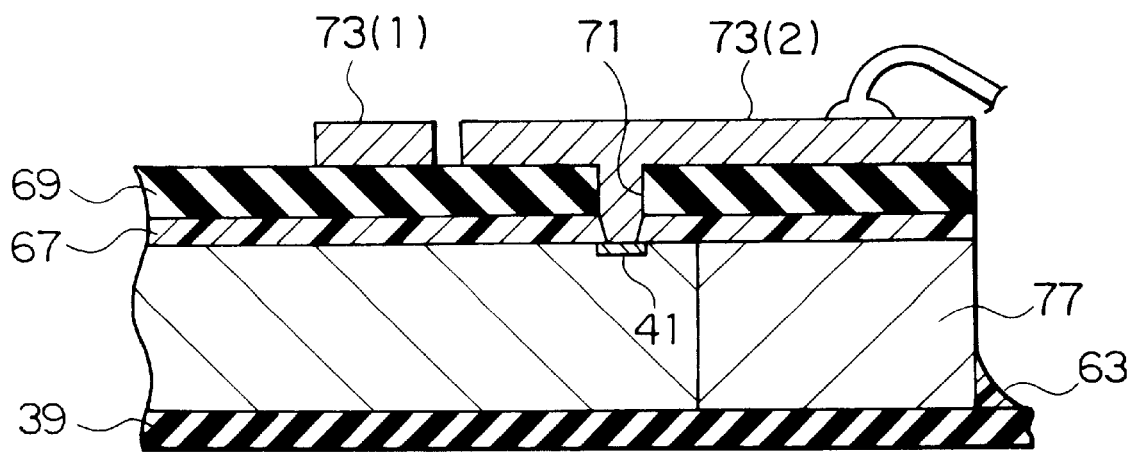
FIG. 21 is a vertical sectional view taken on line 21—21 in FIG. 20.

Turning to FIGS. 20 and 21, attention will be directed to a CSP device according to a fifth preferred embodiment of this invention. It should be noted that the vertical section of FIG. 21 is taken along a polygonal line 21—21 of FIG. 20. The IC chip 31 and the contact sheet 33 (both reference numerals being omitted in FIG. 21) are again depicted in greater detail.

In FIGS. 20 and 21, the silicon chip is surrounded by a semiconductor frame member 77 around its chip edge 75 to provide the chip surface in cooperation with the silicon chip. The insulator tape 69 covers this wider chip area to have the outside or obverse surface wider than an area of the IC chip 31 per se. The conductor patterns or films 73(1) and 73(2) therefore have the wire bonding electrodes 45 outwardly beyond the chip edge 75 to give a fan-out structure to the CSP package. Incidentally, sidewise bulges 79 are depicted in the conductor patterns 73(1) and 73(2), respectively, to imply the support electrodes 43 of the package substrate 33 described with reference to FIGS. 4 and 6. It is now readily understood that these support electrode 43 can be shifted outwardly, by conductor patterns (not shown) formed on the inside or reverse surface of the package substrate 33, for use as the support pads 43 described in conjunction with FIG. 9.

Reviewing FIGS. 18 to 22 and to FIGS. 4 to 6 and 9 to 11, the wire bonding electrodes 45 can be formed in whichever of the fan-in and the fan-out structure. This makes it possible to optimally select an electrode pitch by disposing the conductor patterns, such as 73(1) and 73(2), on the semiconductor frame member 77 or on the marginal area of this wider outside surface of the package substrate 33 as desired. The outside surface may be called a chip surface.

According to the faceup or wire bonding manner described with reference to FIGS. 8 and 14 to 16, a high reliability is given to the multi-chip module of the type illustrated with reference to FIG. 17. This is because any difference in the thermal expansion coefficient between the CSP device and the printed circuit board 39 is absorbed by resiliency of the external metal wires 57, even if sealed in the resin mass 59.

With the facedown or flipchip manner exemplified in connection with FIG. 7, a high integration density is achieved particularly when the IC or the semiconductor chip is attached to the package substrate or the contact sheet 33 in the facedown manner described in conjunction with FIGS. 4 to 6 and 18 to 22. This is because it is unnecessary to use the external metal wires 57 and furthermore the internal metal wires 61.

With the CSP devices of this invention, the multi-chip module has a high yield in the manner exemplified in the following because use of the known good dice is possible. It will be assumed that a conventional CSP device is a known good die with a probability of A % and that such CSP devices, N in number, are used in the multi-chip module. In this event, this multi-chip device has a yield of only (A/100)

$^N$. Accordingly, the conventional CSP devices render the multi-chip module very expensive.

While this invention has thus far been described in specific conjunction with several preferred embodiments thereof and with a multi-chip module according to an example thereof, it is now readily possible for one skilled in the art to put this invention into effect in various other manners. For example, the package substrate 33 may have an area identical in FIGS. 4 to 8 with the chip surface. The CSP device, as called in the foregoing, may be any one of similar semiconductor or LSI devices. It is additionally possible to form the first and the second pads 53 and 55 on the printed circuit board 39 for each of the CSP devices which should be mounted thereon and to select the faceup and the facedown manners of mount in consideration of the characteristics of each CSP device. Moreover, it is possible to mount such CSP devices both on the top and the bottom surfaces of each printed circuit board 39.

What is claimed is:

1. A chip package device comprising an IC chip and a contact sheet having an outside surface and a plurality of facedown electrodes on said outside surface to enclose said IC chip and to provide electric connections to said IC chip, further comprising a plurality of wire bonding electrodes electrically connected on said outside surface to said facedown electrodes, respectively, said IC chip having a chip surface and a plurality of chip electrodes on said chip surface, said contact sheet having an inside surface, wherein said contact sheet comprises on said inside surface a plurality of support pads electrically connected to said facedown electrodes through said contact sheet, respectively, said chip electrodes being electrically connected to said support electrodes, respectively, wherein said facedown electrodes are arranged in a matrix array, said wire bonding electrodes being positioned in a sheet area substantially equal to said chip surface and connected through said contact sheet to said support pads, respectively.

2. A chip package device as claimed in claim 1, wherein said IC chip is supported on said contact sheet with said chip surface brought onto said inside surface, said support pads being positioned so as to be in contact with said chip electrodes, respectively, and being mechanically and electrically connected to said electrodes, respectively.

3. A chip package device as claimed in claim 1, wherein said IC chip is supported on said contact sheet with said chip surface directed away from said inside surface, said contact sheet having the inside surface of a greater area than said chip surface, said support pads being positioned to surround the IC chip supported on said contact sheet, said chip electrodes being electrically connected by metal wires to said support pads, respectively.

4. A chip package device as claimed in claim 3, said inside surface having a marginal area around the IC chip supported on said contact sheet, further comprising a mass of resin covering at least said chip electrodes, said metal wires, and said marginal area.

5. A chip package device comprising an IC chip and a contact sheet having an outside surface and a plurality of facedown electrodes on said outside surface to enclose said IC chip and to provide electric connections to said IC chip, further comprising a plurality of wire bonding electrodes electrically connected on said outside surface to said facedown electrodes, respectively, said IC chip having a chip surface and a plurality of chip electrodes on said chip surface, wherein said contact sheet has an inside surface attached to said chip surface and comprises a plurality of conductor patterns corresponding on said outside surface to said chip electrodes, said conductor patterns having portions extended through said contact sheet to reach said chip electrodes, respectively, each of said conductor patterns providing a corresponding one of said facedown electrodes and a corresponding one of said wire bonding electrodes, wherein said inside surface has an area identical with said chip surface, said wire bonding electrodes being positioned along a periphery of said inside surface.

6. A chip package device comprising an IC chip and a contact sheet having an outside surface and a plurality of facedown electrodes on said outside surface to enclose said IC chip and to provide electric connections to said IC chip, further comprising a plurality of wire bonding electrodes electrically connected on said outside surface to said facedown electrodes, respectively, said IC chip having a chip surface and a plurality of chip electrodes on said chip surface, wherein said contact sheet has an inside surface attached to said chip surface and comprises a plurality of conductor patterns corresponding on said outside surface to said chip electrodes, said conductor patterns having portions extended through said contact sheet to reach said chip electrodes, respectively, each of said conductor patterns providing a corresponding one of said facedown electrodes and a corresponding one of said wire bonding electrodes, wherein said inside surface has a greater area than said chip surface, said wire bonding pads being positioned along a periphery of said inside surface.

\* \* \* \* \*